(12) United States Patent
Liang et al.

(10) Patent No.: US 11,929,355 B2
(45) Date of Patent: Mar. 12, 2024

(54) MIXED LIGHT LIGHT-EMITTING DIODE DEVICE

(71) Applicant: MACROBLOCK, INC., Hsinchu (TW)

(72) Inventors: Shih-Sian Liang, Hsinchu (TW); Wei-Ming Tseng, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 428 days.

(21) Appl. No.: 17/482,345

(22) Filed: Sep. 22, 2021

(65) Prior Publication Data
US 2022/0115360 A1 Apr. 14, 2022

(30) Foreign Application Priority Data

Oct. 8, 2020 (TW) .................................. 109134941

(51) Int. Cl.
| H01L 25/075 | (2006.01) |
| H01L 33/38 | (2010.01) |
| H01L 33/54 | (2010.01) |
| H01L 33/58 | (2010.01) |
| H01L 33/62 | (2010.01) |

(52) U.S. Cl.
CPC ........ *H01L 25/0753* (2013.01); *H01L 33/382* (2013.01); *H01L 33/54* (2013.01); *H01L 33/58* (2013.01); *H01L 33/62* (2013.01)

(58) Field of Classification Search
CPC ... H01L 25/0753; H01L 33/382; H01L 33/54; H01L 33/62; H01L 33/08; H01L 25/0756; H01L 25/0657; H01L 25/167
See application file for complete search history.

(56) References Cited

U.S. PATENT DOCUMENTS

2019/0214373 A1* 7/2019 Kim ........................ H01L 33/08

FOREIGN PATENT DOCUMENTS

| TW | 201214659 | 4/2012 |
| TW | 201301570 | 1/2013 |

* cited by examiner

*Primary Examiner* — Wasiul Haider
(74) *Attorney, Agent, or Firm* — Akerman LLP; Peter A. Chiabotti

(57) ABSTRACT

A mixed light light-emitting diode device includes first, second, and third chips, each having a first-type semiconductor layer with a first surface, a second-type semiconductor layer with a second surface opposite to the first surface, and a third surface indenting from the first surface and situated on the second-type semiconductor layer. The second and third chips have their first surfaces disposed above and facing the first surface of the first chip. A first-type electrode penetrates through the second and first surfaces of the first chip and contacts all first surfaces of first, second, and third chips. Two second-type electrodes each penetrates through the second and third surfaces of the first chip and connect the first chip to one of the second and third chips.

12 Claims, 3 Drawing Sheets

MIXED LIGHT LIGHT-EMITTING DIODE DEVICE

CROSS-REFERENCE TO RELATED APPLICATION

This application claims priority of Taiwanese Invention Patent Application No. 109134941, filed on Oct. 8, 2020.

FIELD

The disclosure relates to a light-emitting diode device, and more particularly to a mixed light light-emitting diode device.

BACKGROUND

Compared with a conventional lighting lamp or a cold cathode fluorescent lamp (CCFL), a light-emitting diode (LED) lamp has advantages, such as low power consumption, small dimension, and long service life. Therefore, the LED lamp has gradually replaced the conventional lighting lamp or the CCFL to be used in general lighting equipment or a backlight module of a liquid crystal display (LCD).

A conventional white LED lamp emits a white light using a light mixing technique. In general, a light mixing technique for white light involves using an LED emitting a blue wavelength light or an ultraviolet (UV) wavelength light to excite a yellow phosphor, or mixing red, green, and blue LED light rays.

Chinese Invention Patent Application Publication No. 201301570 discloses a multi-color LED including an epitaxial substrate, a semiconductor layer epitaxially grown on a surface of the epitaxial substrate, and a first light source, a second light source and a third light source which are epitaxially grown on the semiconductor layer and which are spaced apart from each other. Such multi-color LED can provide light colors needed for different lighting applications by adjusting area of the first, second, and third light sources.

FIG. 1 shows an LED light-emitting device 9 disclosed in Chinese Invention Patent Application Publication No. 201214659, which includes a lead frame 91, a first insulating substrate 92 disposed on the lead frame 91, two first LED chip groups 93 disposed on the first insulating substrate 92 opposite to the lead frame 91, a second insulating substrate 94 disposed on the first insulating substrate 92 opposite to the lead frame 91 and interposed between the first LED chip groups 93, a second LED chip group 95 disposed on the second insulating substrate 94 opposite to the first insulating substrate 92, an encapsulating resin 96 covering the first LED chip groups 93 and the second LED chip group 95, and a wavelength conversion layer 97 disposed on the encapsulating resin 96. The second LED chip group 95 is disposed between the first LED chip groups 93, and is electrically connected to the first LED chip groups 93 in series.

Although the prior art light sources described above can emit light having a desired wavelength through a light mixing technique, the LED chips contained in either of the prior art light sources are arranged in horizontal rows. Therefore, the two-dimensional area spaces occupied by the LEDs of the prior art light sources are difficult to be reduced, thereby limiting a luminous brightness obtainable from a unit area of the LED light sources.

Therefore, there is a need to improve the structure of a mixed light LED device for increasing the luminous brightness obtainable from a unit area thereof.

SUMMARY

An object of the disclosure is to provide a mixed light light-emitting diode device that can alleviate at least one of the drawbacks of the prior art.

According to the disclosure, the mixed light light-emitting diode device includes a first chip, a second chip, a third chip, and an electrode unit.

The first chip includes a first chip first-type semiconductor layer, a first chip P-N junction layer, a first chip second-type semiconductor layer, a first through hole, and two second through holes.

The first chip first-type semiconductor layer has a first chip first surface.

The first chip second-type semiconductor layer is stacked with the first chip first-type semiconductor layer and the first chip P-N junction layer, and has a first chip second surface opposite to the first chip first surface and a first chip third surface indenting from the first chip first surface and situated on the first chip second-type semiconductor layer. The first through hole penetrates through the first chip first surface, the first chip P-N junction layer, and the first chip second surface. Each of two second through holes penetrates through the first chip second and third surfaces, and is spaced apart from the first through hole.

The second chip is spacedly disposed above the first chip, and includes a second chip first-type semiconductor layer and a second chip second-type semiconductor layer.

The second chip first-type semiconductor layer has a second chip first surface which faces the first chip first surface. The second chip second-type semiconductor layer has a second chip second surface opposite to the second chip first surface.

The third chip is spacedly disposed above the first chip, and includes a third chip first-type semiconductor layer and a third chip second-type semiconductor layer.

The third chip first-type semiconductor layer has a third chip first surface which faces the first chip first surface. The third chip second-type semiconductor layer has a third chip second surface opposite to the third chip first surface.

The electrode unit includes a first-type electrode and three second-type electrodes.

The first-type electrode is disposed in the first through hole in an electrically isolated manner, and connects all of the first chip, second chip and third chip first-type semiconductor layers.

Two of the second-type electrodes are respectively disposed in the second through holes, each of the two second-type electrodes connecting one of the second chip and third chip second-type semiconductor layers to the first chip second-type semiconductor layer. A remaining one of the second-type electrodes is disposed on the first chip second surface, and between the first-type electrode and one of the two of the second-type electrodes.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
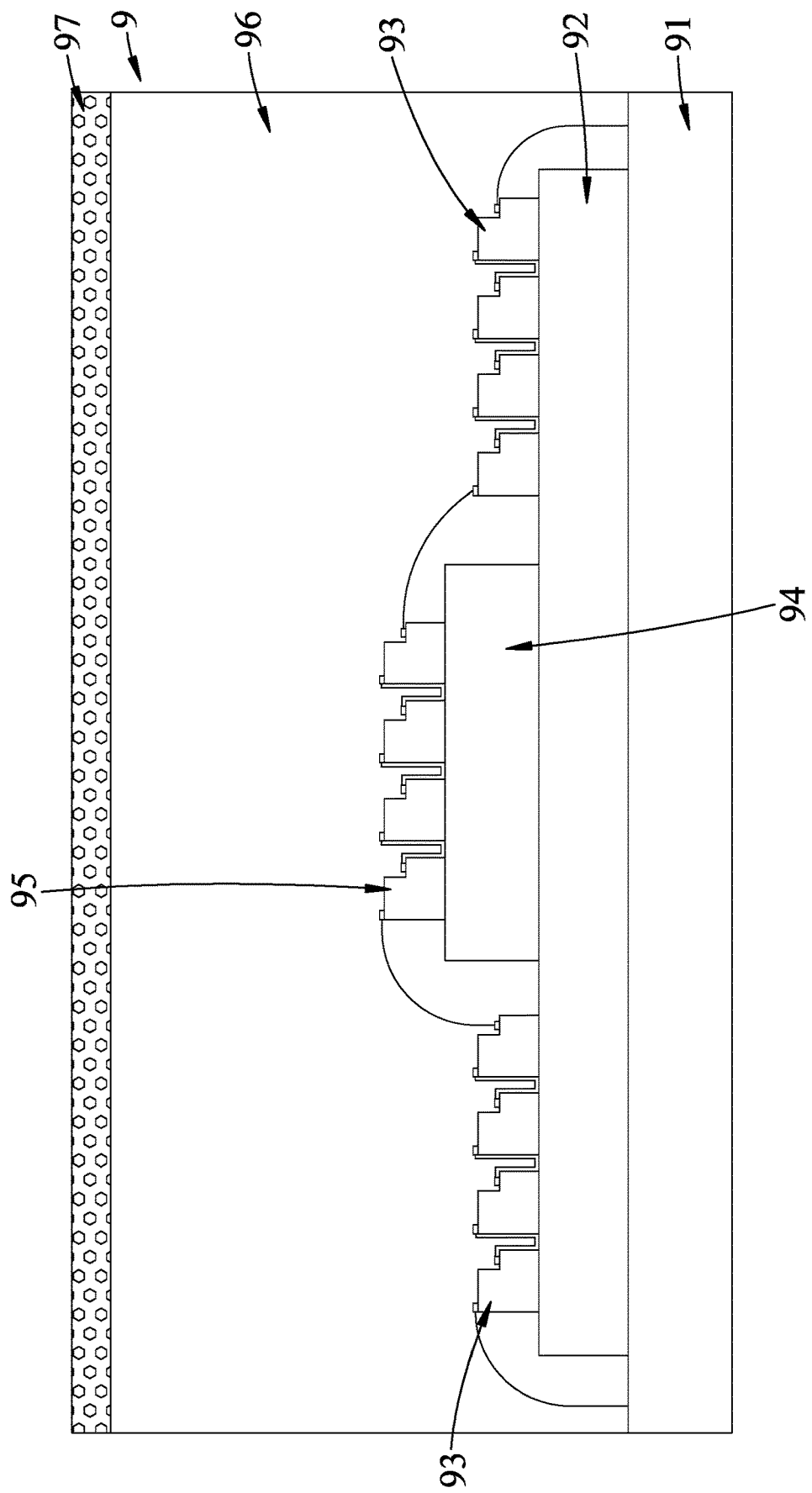
FIG. 1 is a schematic view illustrating a conventional light-emitting device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
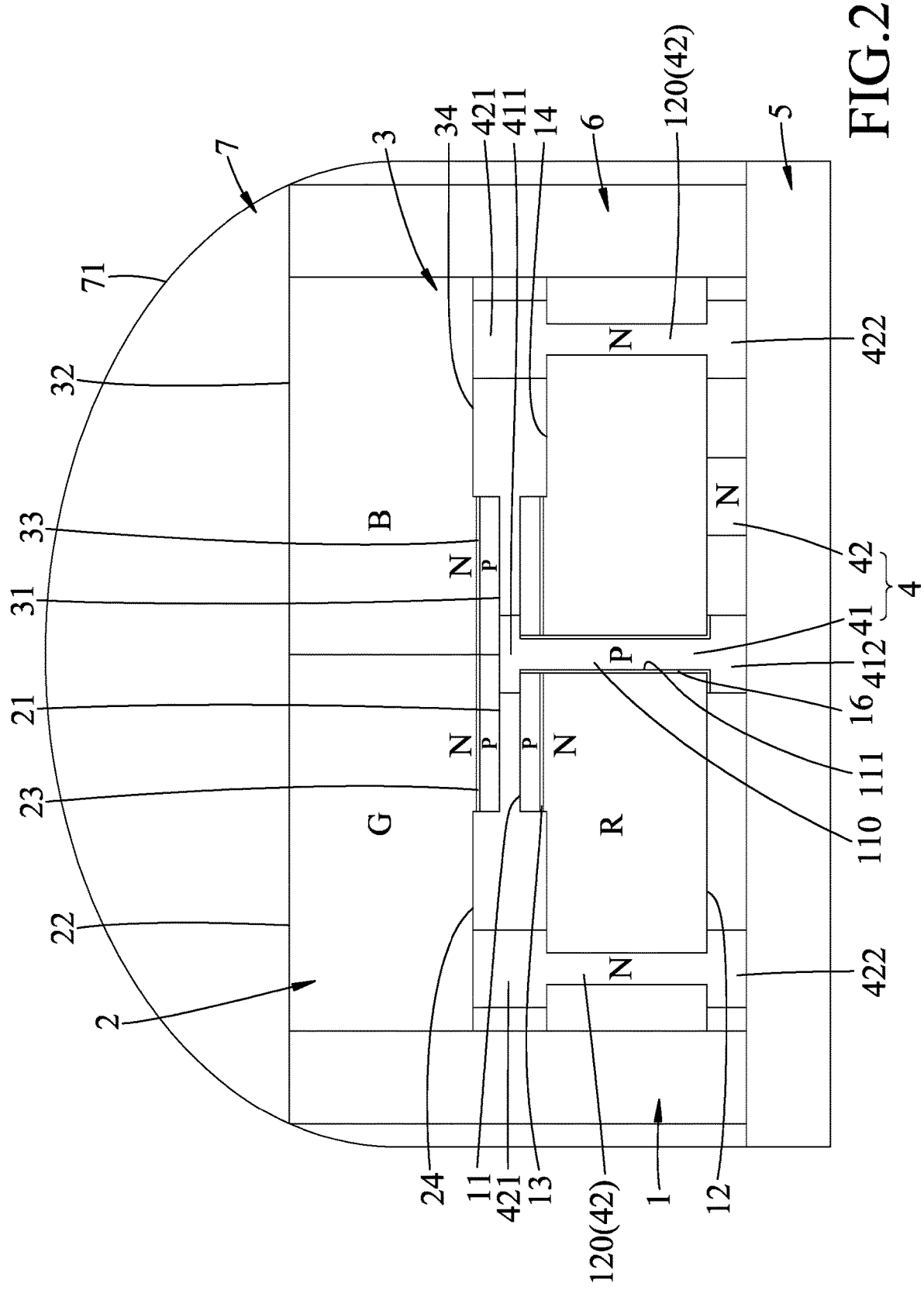
FIG. 2 is a schematic view illustrating a first embodiment of a mixed light light-emitting diode device according to the disclosure.

Referring to FIG. 2, a first embodiment of a mixed light light-emitting diode (LED) device according to the present disclosure includes three lateral chips, i.e., a first chip 1, a second chip 2, and a third chip 3. An electrode unit 4 is connected to the first, second and third chips 1, 2, 3.

The first chip 1 includes a first chip first-type semiconductor layer, a first chip P-N junction layer 13, a first chip second-type semiconductor layer, a first through hole 110, and two second through holes 120. The first chip first-type semiconductor layer has a first chip first surface 11. The first chip second-type semiconductor layer is stacked with the first chip first-type semiconductor layer and the first chip P-N junction layer 13, and has a first chip second surface 12 opposite to the first chip first surface 11 and a first chip third surface 14 indenting from the first chip first surface 11 and situated on the first chip second-type semiconductor layer. The first through hole 110 penetrates through the first chip first surface 11, the first chip P-N junction layer 13, and the first chip second surface 12. Each of the two second through holes 120 penetrates through the first chip second and third surfaces 12, 14, and is spaced apart from the first through hole 110.

The second chip 2 is spacedly disposed above the first chip 1, and includes a second chip first-type semiconductor layer, a second chip second-type semiconductor layer and a second chip P-N junction layer 23. The second chip first-type semiconductor layer has a second chip first surface 21 which faces the first chip first surface 11. The second chip second-type semiconductor layer has a second chip second surface 22 opposite to the second chip first surface 21, and a second chip third surface 24 indenting from the second chip first surface 21 and situated on the second chip second-type semiconductor layer. The second chip P-N junction layer 23 is disposed between the second chip first-type semiconductor layer and the second chip second-type semiconductor layer.

The third chip 3 is spacedly disposed above the first chip 1, and includes a third chip first-type semiconductor layer, a third chip second-type semiconductor layer and a third chip P-N junction layer 33. The third chip first-type semiconductor layer has a third chip first surface 31 which faces the first chip first surface 11. The third chip second-type semiconductor layer has a third chip second surface 32 opposite to the third chip first surface 31, and a third chip third surface 34 indenting from the third chip first surface 31 and situated on the third chip second type semiconductor layer. The third chip P-N junction layer 33 is disposed between the third chip first-type semiconductor layer and the third chip second-type semiconductor layer.

Specifically, each of the first, second, and third chips 1, 2, 3 is a micro LED chip, which is formed by a laser lift off process to remove an expitaxy growth substrate (e.g., a sapphire substrate). Each of the first chip, second chip and third chip first-type semiconductor layers is a P-type semiconductor layer, and each of the first chip, second chip and third chip second-type semiconductor layers is an N-type semiconductor layer. An area of the first chip second surface 12 may be equal to a sum of an area of the second chip second surface 22, and an area of the third chip second surface 32.

The electrode unit 4 includes a first-type electrode 41 and three second-type electrodes 42. In this embodiment, the first-type electrode 41 is a P-type electrode, and the second-type electrodes 42 are N-type electrodes. The first-type electrode 41 is disposed in the first through hole 110 in an electrically isolated manner, and is connected all of the first chip, second chip and third chip first-type semiconductor layers. In particular, the first-type electrode 41 has a common contact part 411 extending upward and out of the first through hole 110 to contact all of the first chip, second chip, and third chip first surfaces 11, 21, 31, and an electrode end 412 that is opposite to the common contact part 411 and that extends downward and out of the first through hole 110.

Two of the second-type electrodes 42 are respectively disposed in the second through holes 120. Each of the two second-type electrodes 42 connects one of the second chip and third chip second-type semiconductor layers to the first chip second-type semiconductor layer. A remaining one of the second-type electrodes 42 is disposed on the first chip second surface 12, and between the first-type electrode 41 and one of the two second-type electrodes 42.

Specifically, each of the two second-type electrodes 42 has a contact part 421 that extends upward and out of a respective one of the second through holes 120 to contact the first chip third surface 14 and one of the second chip and third chip third surfaces 24, 34, and an electrode end 422 that is opposite to the contact part 421 and extends downward and out of the respective second through hole 120.

The first, second, and third chips 1, 2, 3 may emit a first wavelength, a second wavelength, and a third wavelength, respectively. In this embodiment, the first wavelength is a red light wavelength, the second wavelength is a green light wavelength, and the third wavelength is a blue light wavelength. The first chip 1 may further include an insulating layer 16 formed over a boundary wall 111 of the first through hole 110, and extending to the first chip second surface 12. The insulating layer 16 is used to electrically isolate the first-type electrode 41 and the first chip second-type semiconductor layer. In this embodiment, the insulating layer 16 extends further to and covers apart of the first chip second surface 12 surrounding the first through hole 110 to insulate the electrode end 412 from the first chip second surface 12.

In this embodiment, the mixed light LED device is a white LED device having a common anode structure, and further includes a driving circuit board 5, a light shielding wall 6, and an encapsulating member 7.

The driving circuit board 5 is disposed below the first chip 1, and is coupled to the first-type electrode 41 and the second-type electrodes 42. In this embodiment, the driving circuit board 5 is a constant current driving substrate.

The light shielding wall 6 surrounds the first chip 1, the second chip 2 and the third chip 3, and uncovers the second chip second surface 22 and the third chip second surface 32. The encapsulating member 7 covers the first chip 1, the second chip 2, the third chip 3, and the light shielding wall 6. In addition, the encapsulating member 7 has a curved surface 71 that is convexed upward in a direction away from the second chip and third chip second surfaces 22, 32.

Figure 3:
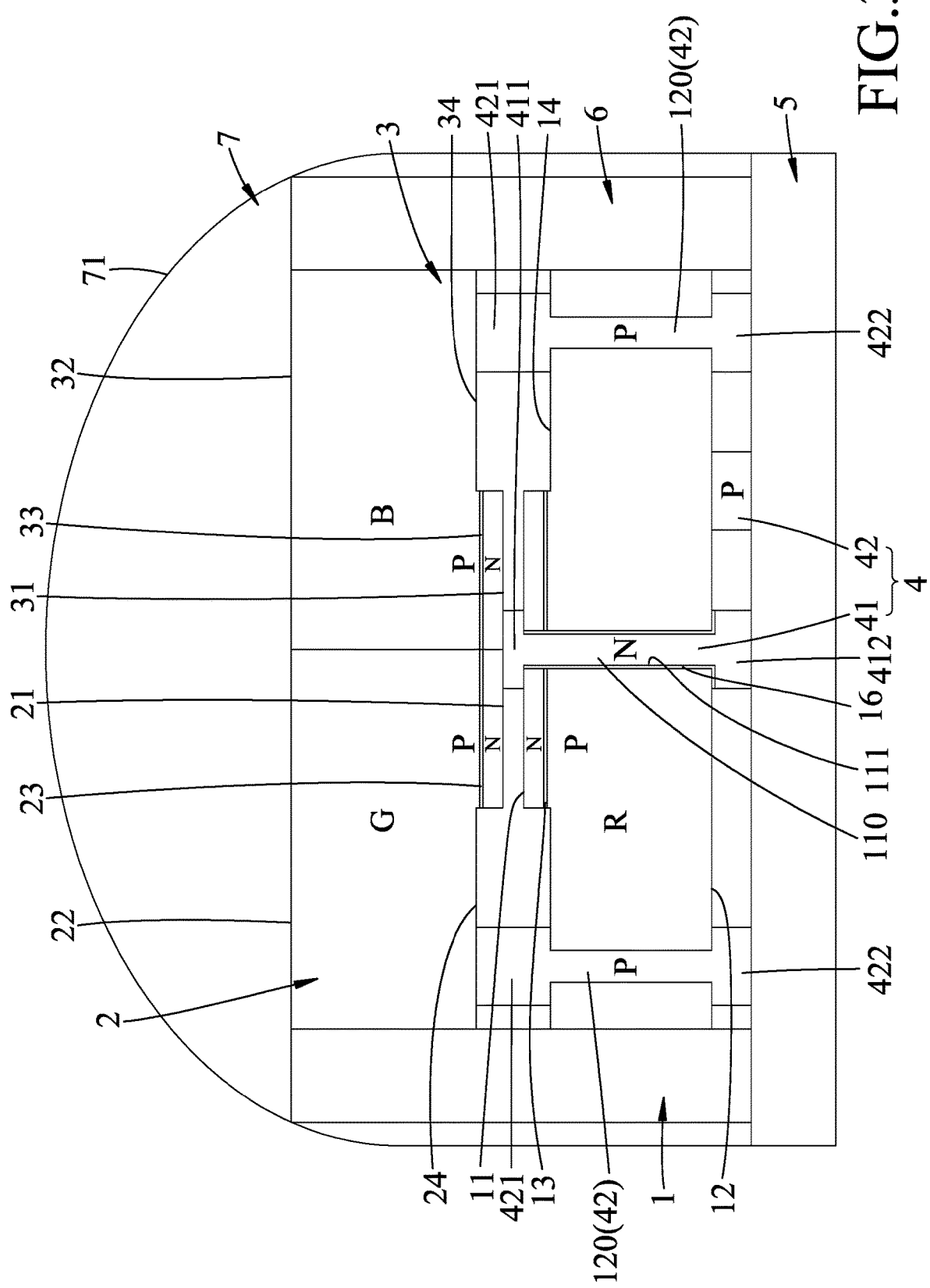
FIG. 3 is a schematic view illustrating a second embodiment of the mixed light light-emitting diode device according to the disclosure.

Referring to FIG. 3, a second embodiment of the mixed light LED device according to the disclosure is generally similar to the first embodiment, except that in the second embodiment, each of the first chip, second chip and third chip first-type semiconductor layers is an N-type semiconductor layer, each of the first chip, second chip and third chip second-type semiconductor layers is a P-type semiconductor layer, the first-type electrode 41 is an N-type electrode, and the second-type electrodes 42 are P-type electrodes. In this embodiment, the mixed light LED device is a white LED device having a common cathode structure.

In sum, by virtue of the first-type electrode 41 disposed in the first through hole 110, the two second-type electrodes 42 respectively disposed in the second through holes 120, the second and third chips 2, 3 can be disposed vertically above the first chip 1; the first-type electrode 41 can be a common electrode shared by the first chip, second chip and third chip first-type semiconductor layers; and each of the second chip and third chip second-type semiconductor layers can be electrically connected to the first chip second-type semiconductor layer through one of the second-type electrodes 42. Compared to the prior art light sources described hereinbefore, the luminous intensity (per unit area) of the mixed light LED device of the disclosure is increased, and the two dimensional area space occupied by the LED chips is reduced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A mixed light light-emitting diode device, comprising:
   a first chip including
      a first chip first-type semiconductor layer having a first chip first surface,
      a first chip P-N junction layer,
      a first chip second-type semiconductor layer stacked with said first chip first-type semiconductor layer and said first chip P-N junction layer, and having a first chip second surface opposite to said first chip first surface and a first chip third surface indenting from said first chip first surface and situated on said first chip second-type semiconductor layer,
      a first through hole penetrating through said first chip first surface, said first chip P-N junction layer, and said first chip second surface, and
      two second through holes, each of which penetrates through said first chip second and third surfaces, and is spaced apart from said first through hole;
   a second chip spacedly disposed above said first chip, and including
      a second chip first-type semiconductor layer having a second chip first surface which faces said first chip first surface, and
      a second chip second-type semiconductor layer having a second chip second surface opposite to said second chip first surface;
   a third chip spacedly disposed above said first chip, and including
      a third chip first-type semiconductor layer having a third chip first surface which faces said first chip first surface, and
      a third chip second-type semiconductor layer having a third chip second surface opposite to said third chip first surface; and
   an electrode unit including
      a first-type electrode disposed in said first through hole in an electrically isolated manner, and connecting all of said first chip, second chip and third chip first-type semiconductor layers, and
      three second-type electrodes, two of said second-type electrodes being respectively disposed in said second through holes, each of said two of said second-type electrodes connecting one of said second chip and third chip second-type semiconductor layers to said first chip second-type semiconductor layer, a remaining one of said second-type electrodes being disposed on said first chip second surface and between said first-type electrode and one of said two of said second-type electrodes.

2. The mixed light light-emitting diode device of claim 1, wherein said first chip further includes an insulating layer formed over a boundary wall of said first through hole, and extending to said first chip second surface.

3. The mixed light light-emitting diode device of claim 2, wherein said first-type electrode has a common contact part extending out of said first through hole to contact all of said first chip, second chip, and third chip first surfaces.

4. The mixed light light-emitting diode device of claim 3, wherein said first-type electrode further has an electrode end that is opposite to said common contact part and extends out of said first through hole, said insulating layer extending further to and covering a part of said first chip second surface surrounding said first through hole to insulate said electrode end from said first chip second surface.

5. The mixed light light-emitting diode device of claim 1, wherein each of said first chip, second chip and third chip first-type semiconductor layers is a P-type semiconductor layer, each of said first chip, second chip and third chip second-type semiconductor layers is an N-type semiconductor layer, said first-type electrode is a P-type electrode, and said second-type electrodes are N-type electrodes.

6. The mixed light light-emitting diode device of claim 1, wherein each of said first chip, second chip and third chip first-type semiconductor layers is an N-type semiconductor layer, each of said first chip, second chip and third chip second-type semiconductor layers is a P-type semiconductor layer, said first-type electrode is an N-type electrode, and said second-type electrodes are P-type electrodes.

7. The mixed light light-emitting diode device of claim 1, further comprising a driving circuit board disposed below said first chip, and coupled to said first-type electrode and said second-type electrodes.

8. The mixed light light-emitting diode device of claim 1, further comprising a light shielding wall surrounding said first chip, said second chip and said third chip, and uncovering said second chip second surface and said third chip second surface.

9. The mixed light light-emitting diode device of claim 8, further comprising an encapsulating member covering said first chip, said second chip, said third chip, and said light shielding wall.

10. The mixed light light-emitting diode device of claim 9, wherein said encapsulating member has a curved surface that is convexed upward in a direction away from said second chip and third chip second surfaces.

11. The mixed light light-emitting diode device of claim 1, wherein an area of said first chip second surface is equal to a sum of an area of said second chip second surface, and an area of said third chip second surface.

12. The mixed light light-emitting diode device of claim 1, wherein said second chip second-type semiconductor layer further has a second chip third surface indenting from said second chip first surface and situated on said second chip second-type semiconductor layer, said third chip second-type semiconductor layer further having a third chip third surface indenting from said third chip first surface and situated on said third chip second-type semiconductor layer, each of said two of said second-type electrodes having a contact part that extends out of a respective one of said second through holes to contact one of said second chip and third chip third surfaces, and an electrode end opposite to said contact part and extending out of the respective second through hole.

* * * * *